(12) United States Patent  (10) Patent No.: US 7,854,805 B2
Kraus et al.  (45) Date of Patent: Dec. 21, 2010

(54) PLASMA PROCESSING PLANT

(75) Inventors: Andreas Kraus, Regensburg (DE); Jochen Krueger, Thalmassing (DE)

(73) Assignee: Krones AG, Neutraubling (DE)

( * ) Notice: Subject to any disclaimer, the term of this patent is extended or adjusted under 35 U.S.C. 154(b) by 40 days.

(21) Appl. No.: 12/204,099

(22) Filed: Sep. 4, 2008

(65) Prior Publication Data

US 2009/0081382 A1    Mar. 26, 2009

(30) Foreign Application Priority Data

Sep. 20, 2007  (DE) .................. 10 2007 045 141

(51) Int. Cl.
   *C23C 16/00*  (2006.01)
   *B05D 7/22*  (2006.01)
(52) U.S. Cl. .................. 118/719; 118/715; 118/733; 427/569; 427/230; 427/237; 427/238
(58) Field of Classification Search .................. 427/230, 427/238, 237; 118/719, 733; 141/59; 137/588
See application file for complete search history.

(56) References Cited

U.S. PATENT DOCUMENTS 3,460,590 A * 8/1969 Robbins .................. 141/7

| 5,308,649 A | 5/1994 | Babacz |
| 6,328,805 B1 | 12/2001 | Rius et al. |
| 6,818,068 B1 | 11/2004 | Guiffant et al. |
| 2005/0233077 A1 | 10/2005 | Lizenberg et al. |

FOREIGN PATENT DOCUMENTS

| DE | 10331946 | 2/2005 |
| DE | 60022377 | 6/2006 |
| EP | 1391535 | 2/2004 |
| WO | WO-2006/005698 | 1/2006 |

OTHER PUBLICATIONS

Search Report for German Patent Application No. 10 2007 045 141.7 dated Jun. 13, 2008.

* cited by examiner

*Primary Examiner*—Timothy H Meeks
*Assistant Examiner*—Collette Ripple
(74) *Attorney, Agent, or Firm*—Marshall, Gerstein & Borun LLP

(57) ABSTRACT

A plasma processing plant for plastic bottles, having a vacuum chamber arranged inside the processing chamber and when a respective bottle opening is pressed against a valve, the valve will open and establish a connection between the interior of the bottle and the vacuum chamber, and the chambers are continuously sealed against one another in a gastight fashion. With such approach, the gas can be conducted more easily and the number of control mechanisms can be reduced.

6 Claims, 3 Drawing Sheets

PLASMA PROCESSING PLANT

CROSS-REFERENCE TO RELATED APPLICATION

The present application claims the benefit of priority of German Patent Application No. 102007045141.7, filed Sep. 20, 2007. The entire text of the priority application is incorporated herein by reference in its entirety.

FIELD OF THE DISCLOSURE

The disclosure relates to a plasma processing plant of the type using a processing chamber into which bottles to be processed can be fed, and a supply unit for a process gas.

BACKGROUND

The preservability of drinks in PET bottles is reduced to an undesirably short period of time by the limited gas tightness of the bottle wall. This applies especially to the storage of carbonated drinks. Hence, various attempts have already been made for improving the gas tightness of the bottle wall by plasma coating, e.g. by applying a gas barrier layer of $SiO_2$.

Such a method is known e.g. from US 2005/0233077 A1 in the case of which up to two PET bottles are arranged in a common processing chamber and evacuated through a respective contact pressure valve and a common line. For this purpose, the bottles are first positioned on the contact pressure valves, the processing chamber being connected to the interior of the bottles in the open condition of the valve. The valve is closed by pressing the bottle thereagainst and the processing chamber is thus sealed against the interior of the bottles. The evacuation of the bottles and of the processing chamber as well as the supply of process gas are controlled through separate valves in the lines.

U.S. Pat. No. 6,328,805 B1 additionally discloses a plasma processing plant in the case of which the processing chamber and the interior of the bottle are evacuated in common. A valve, which can be used for adjusting the differential pressure, is provided between the processing chamber and an area connected to the bottle interior. The control of the process gas supply is executed via a separate valve. The processing chamber can only accommodate one bottle at a time and is opened between the respective coating processes. The pressure difference adjusted with the aid of the valve thus ceases to exist.

EP 1 391 535 B1 additionally discloses a contact pressure valve which seals the interior of a bottle to be evacuated against the exterior of said bottle, when the bottle opening is pressed against said valve.

SUMMARY OF THE DISCLOSURE

It is the aspect of the present disclosure to provide a simplified device for coating continuously fed PET bottles, in particular a plasma processing plant with simplified gas guidance and a smaller number of control mechanisms. More particularly, in one aspect, the disclosure concerns a plasma processing plant of the type using a processing chamber into which bottles to be processed can be fed, a vacuum chamber, a valve which is connected to the vacuum chamber and which, in its open condition, connects the interior of the bottle via an evacuation channel to the vacuum chamber and seals the interior of the bottle against the processing chamber in a gastight fashion, and further comprising a supply unit for a process gas.

According to another aspect of the present disclosure, the vacuum chamber is arranged inside the processing chamber so that a plurality of PET bottles can be evacuated successively in a common processing chamber. In view of the fact that the vacuum chamber and the processing chamber are sealed against one another in a gastight fashion throughout the whole coating process, a constant differential pressure can be maintained between said chambers. Since the valve is opened in response to the pressure which the bottle opening applies to the inlet area of the valve, the valve can be opened automatically, e.g. along a guiding rail, and the use of a separate triggering mechanisms can thus be dispensed with.

Another advantageous embodiment is so conceived that, in the open condition of the valve, the supply unit for a process gas is connected to the interior of the bottle via a supply channel of the valve, whereas, in the closed condition of the valve, the supply channel is interrupted. The use of an additional control mechanism for guiding the process gas can thus be dispensed with.

A particularly advantageous embodiment is so conceived that, in the closed condition of the valve, the supply unit for the process gas is connected to a discharge channel of the valve. In this case, an additional complicated control of the process gas flow for each individual valve can be dispensed with, when a large number of valves is integrated in a carrousel-type unit.

According to another embodiment, the discharge channel of the valve is connected to the vacuum chamber. In this case, additional outgoing lines can be dispensed with.

Another advantageous embodiment is so conceived that a pressure difference continuously exists between the processing chamber and the vacuum chamber. The sequence of evacuation steps can thus be executed and supervised more easily.

Another particularly advantageous embodiment is so conceived that the vacuum chamber is supported such that it is rotatable relative to the processing chamber. This allows the processing chamber to be designed as a carrousel-type unit in the case of which the bottles are fed continuously and coated at individual stations.

According to a particularly advantageous embodiment of the present invention, the pressure generated in the interior of the bottle is 10-50 mbar lower than the pressure prevailing in the processing chamber. This creates optimum conditions for igniting the plasma in the bottle interior and for avoiding an ignition of the plasma in the outer area of the bottle as well as a deformation of the bottle caused by an excessively high pressure difference.

BRIEF DESCRIPTION OF THE DRAWINGS

In the following, the present disclosure will be explained in more detail on the basis of an embodiment shown in the drawing, in which.

DETAILED DESCRIPTION

Figure 1:
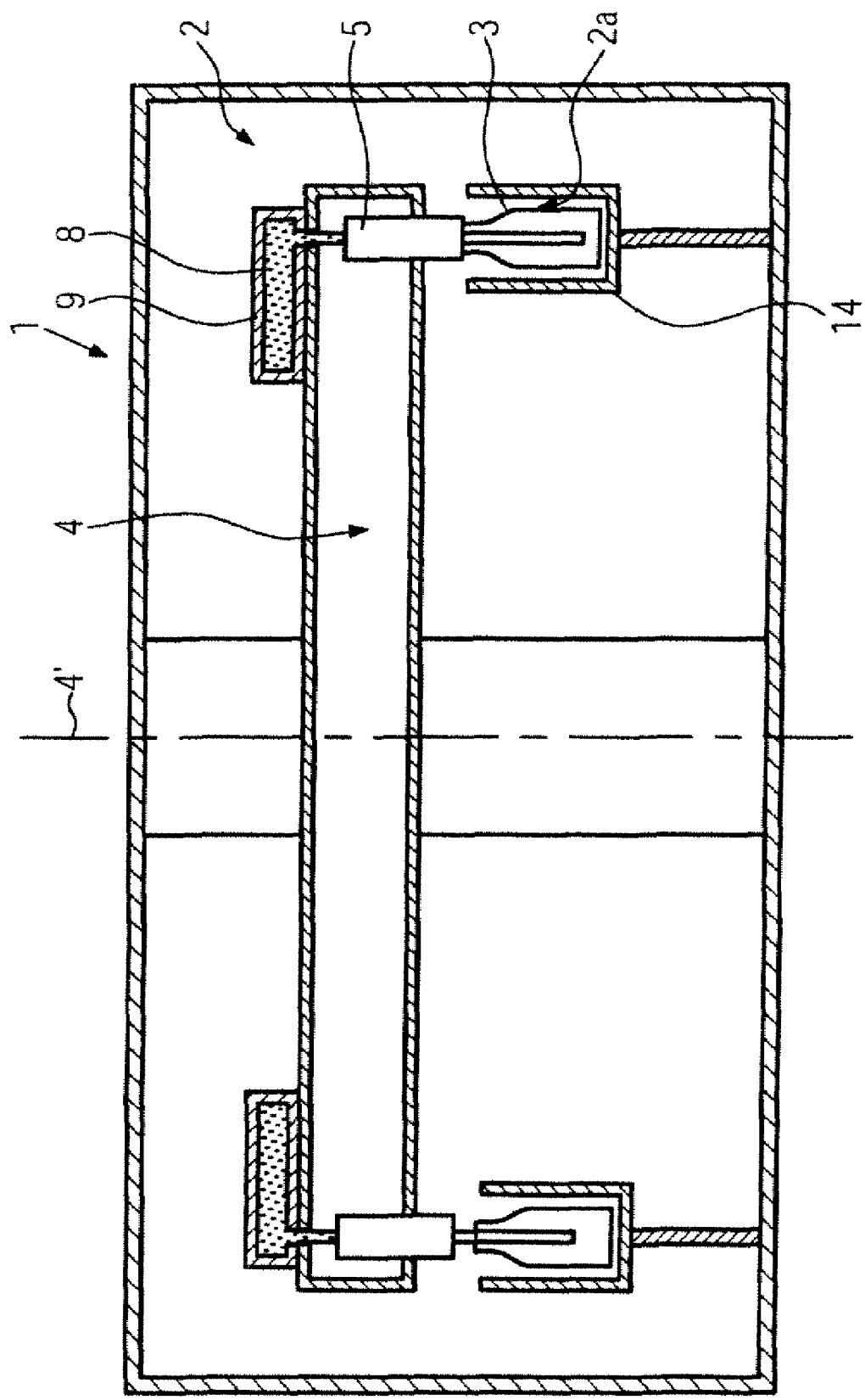
FIG. 1 shows a plasma processing plant in a schematic sectional view.

FIG. 1 shows a plasma processing plant 1 with a processing chamber 2 for the bottles 3 to be processed, the processing chamber 2 being configured as a carrousel-type unit. A substantially rotation-symmetric vacuum chamber rotates in the interior of the processing chamber 2 about the axis 4'. The processing chamber 2 and the vacuum chamber 4 are evacuated so that a predetermined pressure difference between the two chambers 2 and 4 will continuously exist.

The valves 5, only two of which are exemplarily shown in FIG. 1, are arranged in an annular configuration in the circumferential peripheral region of the vacuum chamber 4. On the upper side of the vacuum chamber 4, a supply unit 8 for a process gas 9 is arranged above each valve 5. FIG. 1 shows, on the left, a bottle 3 positioned below the valve 5 and, on the right, a bottle 3 pressed against the valve 5. An annular or U-shaped electrode 14 extends below the bottles 3 to be processed; said electrode 14 consists preferably of copper, but it can be provided with a coating or jacket consisting e.g. of plastic material. The shape of the electrode 14 is explicitly not limited to a U-shape. The bottles are held by conventional technical means, preferably a holding clip, and they are pressed against the valve. This process can be carried out by a guiding rail or by other means, e.g. by means of electric or pneumatic drives.

Figure 2:
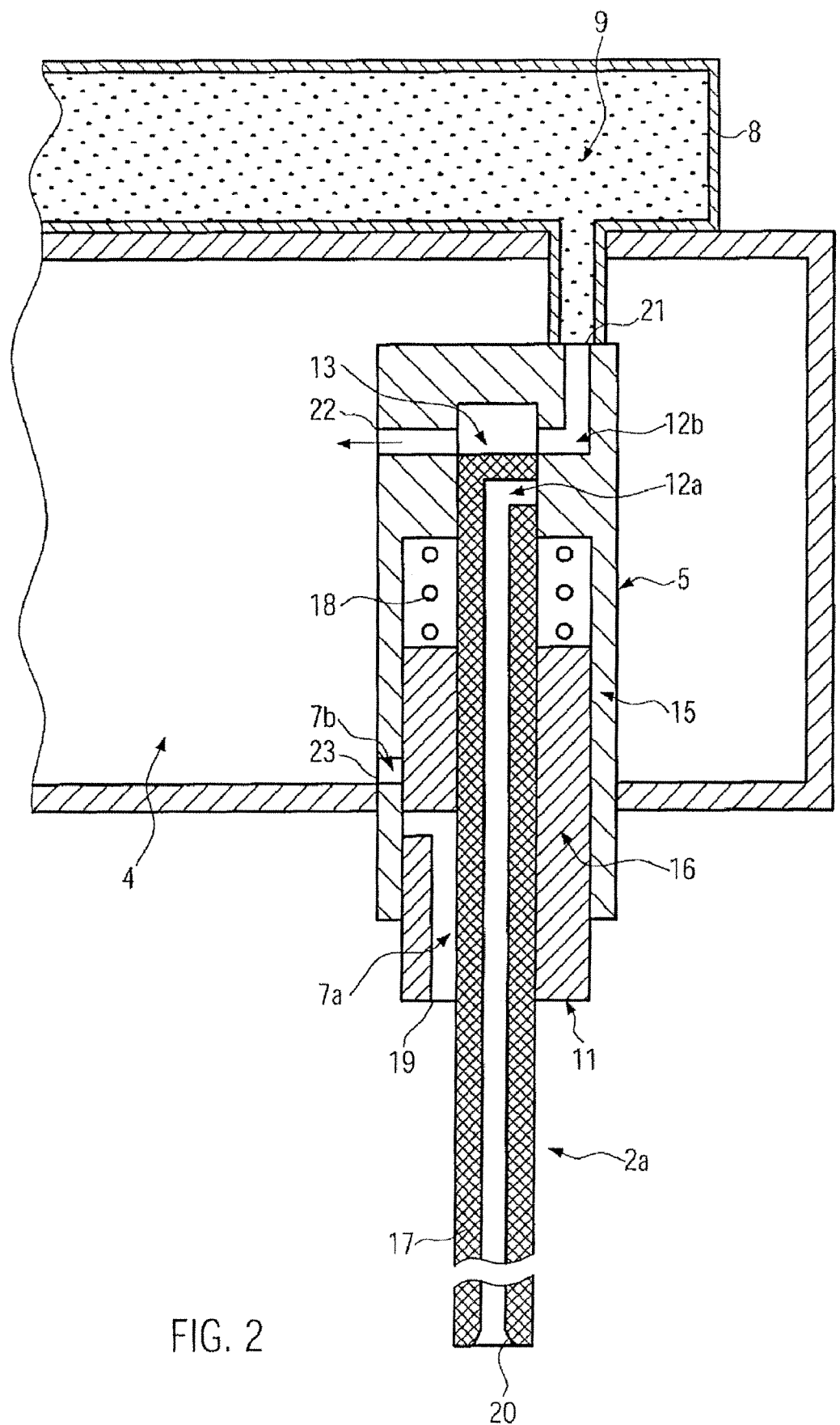
FIG. 2 shows a valve of the plasma processing plant in a closed condition in a schematic sectional view.

FIG. 2 shows the valve 5 in a closed condition as well as the adjoining areas of the vacuum chamber 4 and of the supply unit 8 for the process gas 9. The valve 5 is shown schematically in a tripartite form comprising an essentially cylindrical valve body 15 and a plunger 16 which is movable within said valve body 15 and within which the tube 17, which can be implemented e.g. as a tubular microwave transmitter or as a tubular electrode, is secured in position. For the sake of clarity, the representation of additional sealing components has been dispensed with. The bias of the pressure spring 18 presses the plunger 16 in the direction of the inlet opening 11 against a stop, which is not shown. Hence, the valve 5 is closed at its normal position.

The lower end face of the plunger 16 defines the inlet area 11 of the valve 5 comprising the evacuation opening 19 and the evacuation channel 7a. In the closed condition of the valve 5, the evacuation channel 7a ends at the wall of the valve body 15. Hence, the closed valve 5 seals the processing chamber 2 against the vacuum chamber 4 in a gastight fashion.

The inner wall of the tube 17 defines the supply channel 12a for the process gas 9. Since also the upper end of the supply channel 12a ends at the wall of the valve body 15 in the closed condition of the valve 5, the supply channel 12a does not communicate with the supply unit 8 for the process gas 9 when the valve 5 is closed.

The upper area of the valve body 15 has an inlet opening 21 for the process gas 9, which communicates with the supply unit 8 and which is connected to the outlet opening 22 via the supply channel 12b and the discharge channel 13. In the present embodiment, the outlet opening 22 leads directly into the vacuum chamber 4 so that the process gas 9 will be conducted into said vacuum chamber 4 in the closed condition of the valve 5. Alternatively, the outlet opening 22 may, however, also be connected to a separate discharge means for the process gas 9, which is not shown.

Due to this guidance of the process gas flow, a complicated control of the process gas flow for each individual valve can be dispensed with, when a large number of valves is integrated in a carrousel-type unit. It is, however, also imaginable to interrupt the supply of gas by mechanical, electrical or pneumatic shut-off devices which are coupled to the position of the valve.

Figure 3:
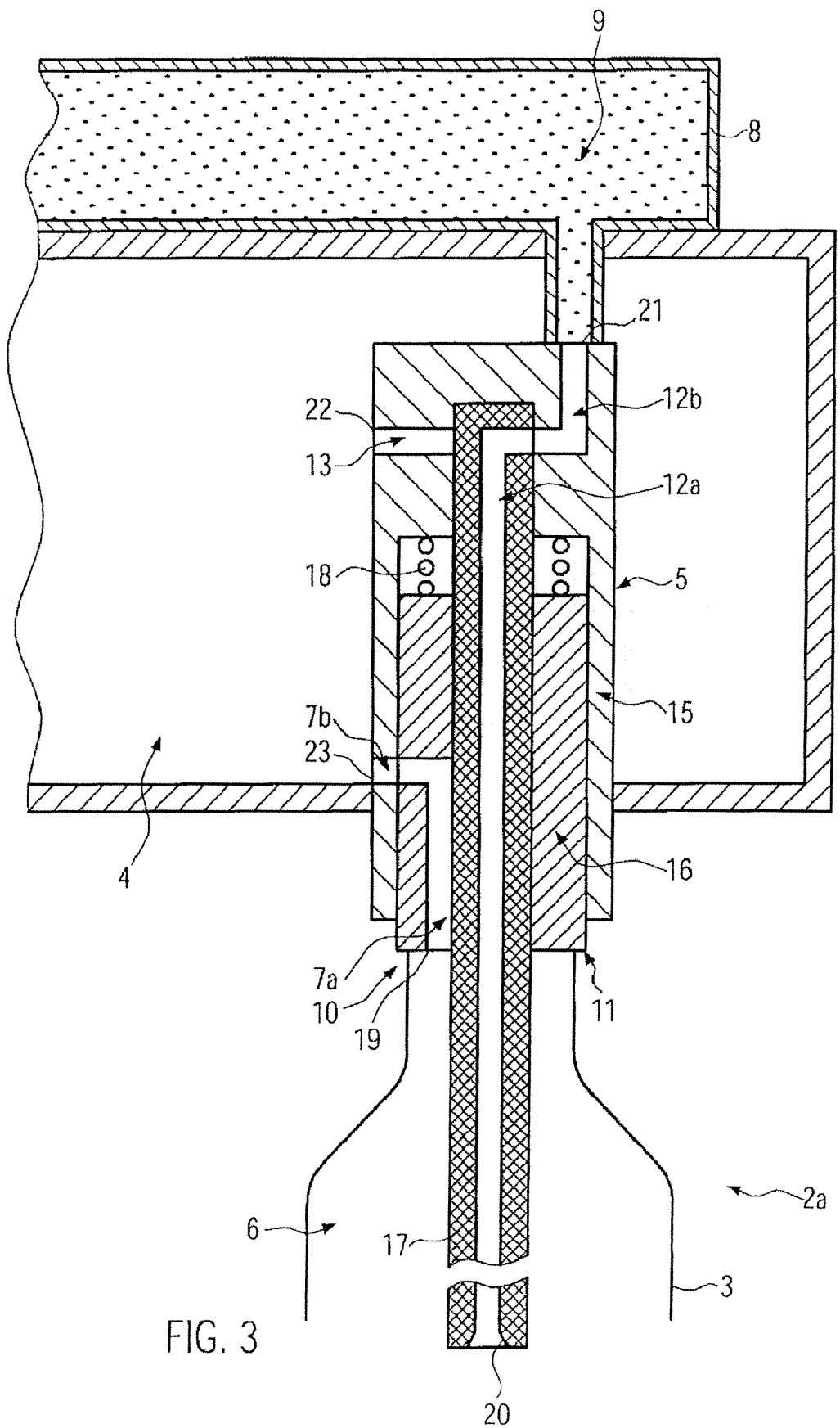
FIG. 3 shows a valve of the plasma processing plant in an open condition in a schematic sectional view.

FIG. 3 shows the valve 5 with a bottle 3 connected thereto and in an open condition. Other than in the case of FIG. 2, the plunger 16 is pressed upwards against the force of the pressure spring 18 by the pressure with which the bottle opening 10 is pressed against the inlet area 11. This has the effect that a connection will be established between the evacuation channel 7a in the plunger 16 and the evacuation channel 7b and the outlet opening 23 in the wall of the valve body 15. It follows that, in the open condition of the valve, pressure compensation will take place between the vacuum chamber 4 and the interior 6 of the bottle 3.

The inlet area 11 of the valve 5 is provided with a suitable sealing element, e.g. a flexible sealing ring, which seals the interior 6 of the bottle 3 against the processing chamber 2 in a gastight fashion.

Simultaneously, the supply channel 12a is connected to the inlet opening 21 via the supply channel 12b and the connection between the supply channel 12b and the discharge channel 13 is interrupted. The process gas 9 is consequently conducted through the tube 17 and the outlet opening 20 into the interior 6 of the bottle 3 and an ingress of process gas 9 into the processing chamber 2 is prevented by the sealing contact between the bottle opening 10 and the inlet area 11.

In addition, the plunger 16 can be configured as a rotatably supported component which allows the bottle 3 to rotate during the process.

When the bottle 3 is lowered, the valve closes automatically due to the bias of the pressure spring 18, so that the connection between the channel sections 7a and 7b as well as 12a and 12b will be interrupted as long as the bottle opening 10 is still in gastight contact with the inlet area 11. An ingress of process gas 9 into the processing chamber 2 and a pressure compensation between said processing chamber 2 and the vacuum chamber 4 will be prevented in this way. Simultaneously, excessive process gas will be conducted into the vacuum chamber 4.

In the following, the mode of operation of the embodiment of a plasma processing plant according to the present invention, which is shown in the drawing, will be explained:

The bottles 3 to be processed are continuously fed through a pressure lock into the processing chamber 2 that has been evacuated to a predetermined degree and are entrained by holding devices, which are coupled in a suitable fashion to the rotating vacuum chamber 4, so that each bottle 3 will be positioned below a valve 5. The bottles 3 are advanced along a guiding rail and are thus pressed against the inlet areas 11 of the valves 5 with their bottle openings 10, whereby said valves 5 will be opened.

The individual bottles 3, which are connected to the open valves 5, communicate through the evacuation channels 7a and 7b with the common vacuum chamber 4 and are evacuated down to a predetermined pressure for a predetermined period of time.

With simultaneous sealing of the bottle opening 10, this leads to the generation of a pressure difference between the interior 6 of the bottle 3 and the processing chamber 2 so that, outside the bottle 3, a plasma cannot ignite, since the external pressure is either too low or too high, whereas the pressure in the interior of the bottle 3 is ideal for a plasma process.

During evacuation of the bottle 3, the process gas 9 for the plasma processing is conducted through the supply channel 12a, 12b into the bottle 3. A pressure of approx. 0.1 mbar should prevail in the bottle 3 under a gas load of approx. 50 sccm of process gas 9 (under European standard conditions).

Since a continuously maintained pressure difference exists between the processing chamber 2 and the vacuum chamber 4, conditions suitable for igniting the plasma are obtained in all the bottles 3 after an approximately constant period of time after the expiration of which the respective bottle 3 is coated by igniting the plasma.

In the present embodiment, only the inner wall of the bottle 3 is to be processed by a plasma process. The pressure outside the bottle 3 should be a pressure at which plasma can no longer ignite. Such a suitable pressure is e.g. a relative overpressure of approx. 10 mbar in comparison with the pressure in the interior 6 of the bottle 3. The relative overpressure must, however, not be excessively high, so that a PET disposable bottle cannot be compressed, i.e. it should be smaller than approx. 40-50 mbar in comparison with the internal pressure.

Depending on the pressure difference between the processing chamber 2 ad the vacuum chamber 4, it can, however, also be achieved that the plasma ignites only outside, but not inside the bottle 3.

When the bottles 3 have been coated, they are lowered along a descending guiding rail and discharged through a pressure lock.

When using the present invention for coating the interior of a bottle 3, the pressure in the processing chamber 2 is preferably adjusted such that a plasma cannot ignite, and the pressure in the vacuum chamber 4 is preferably adjusted such that a plasma is produced in the interior 6 of the bottle connected to the vacuum chamber 4.

When using the present invention for coating the exterior of a bottle 3, the pressure in the vacuum chamber 4 is preferably adjusted such that a plasma cannot ignite, and the pressure in the processing chamber 2 is preferably adjusted such that a plasma is produced in the outer area 2a of the bottle 3 connected to the vacuum chamber 4.

We claim:

1. A plasma processing plant comprising:
    a processing chamber into which the bottles to be processed can be fed;
    a vacuum chamber;
    a valve which is connected to the vacuum chamber and which, in its open condition, connects the interior of the bottle via an evacuation channel to the vacuum chamber and seals said interior of the bottle against the processing chamber in a gastight fashion;
    a supply unit for a process gas for plasma processing,
    the vacuum chamber being arranged inside the processing chamber;
    in the closed condition of the valve, the vacuum chamber is sealed against the processing chamber in a gastight fashion; and
    the valve is implemented such that it will be opened by a predetermined pressure which the bottle opening applies to an inlet area of the valve.

2. A plasma processing plant according to claim 1, wherein in the open condition of the valve, the supply unit for the process gas is connected to the interior of the bottle via a supply channel of the valve and that, in the closed condition of the valve, the supply channel is interrupted.

3. A plasma processing plant according to claim 2, wherein in the closed condition of the valve, the supply unit for the process gas is connected to a discharge channel of the valve.

4. A plasma processing plant according to claim 3, wherein the discharge channel of the valve is connected to the vacuum chamber.

5. A plasma processing plant according to claim 1, wherein a pressure difference continuously exists between the processing chamber and the vacuum chamber.

6. A plasma processing plant according to claim 1, wherein the vacuum chamber is supported such that it is rotatable relative to the processing chamber.

* * * * *